(12) United States Patent
Nguyen

(10) Patent No.: US 6,809,522 B2
(45) Date of Patent: Oct. 26, 2004

(54) AUTOMATED ELECTROSTATIC DISCHARGE DEVICE TESTING SYSTEM

(75) Inventor: Hoa Nguyen, Santa Ana, CA (US)

(73) Assignee: Semtronics, Garden Grove, CA (US)

(*) Notice: Subject to any disclaimer, the term of this patent is extended or adjusted under 35 U.S.C. 154(b) by 0 days.

(21) Appl. No.: 10/174,996

(22) Filed: Jun. 20, 2002

(65) Prior Publication Data

US 2003/0234651 A1 Dec. 25, 2003

(51) Int. Cl.$^7$ ............................................. G01R 29/12
(52) U.S. Cl. ................................... 324/457; 702/123
(58) Field of Search ............................... 324/454, 457, 324/510, 537, 557, 676, 698; 702/123

(56) References Cited

U.S. PATENT DOCUMENTS

| | | | | |
|---|---|---|---|---|
| 648,109 | A | * 4/1900 | Kelly | 139/98 |
| 4,961,157 | A | * 10/1990 | Nick et al. | 702/82 |
| 5,684,726 | A | * 11/1997 | Osborn et al. | 702/123 |
| 5,991,145 | A | * 11/1999 | Lagrotta et al. | 361/212 |
| 6,078,875 | A | * 6/2000 | Jubin et al. | 702/123 |
| 6,450,411 | B1 | * 9/2002 | Rash et al. | 236/44 A |
| 6,510,987 | B1 | * 1/2003 | Hengriprasopchoke et al. | 235/380 |

* cited by examiner

Primary Examiner—N. Le
Assistant Examiner—Walter Benson
(74) Attorney, Agent, or Firm—Fitch, Even, Tabin & Flannery

(57) ABSTRACT

The present invention is a system for automatically testing and providing notification of an efficacy failure of an electrostatic discharge (ESD) device or devices. The system includes testing circuitry for testing the efficacy of one or more ESD devices, a memory for storing ESD device testing protocol, ESD device test results, employee identification information, e-mail messaging software, and interface connection software, an internet interface, and a processor for controlling the testing circuitry in accordance with the executed process steps of the ESD device testing protocol and for controlling the storing of the ESD device test results in memory, wherein the processor automatically provides email notification of efficacy failure of an ESD device by collecting and formatting an ESD device test result into an e-mail message using the stored e-mail messaging software and forwarding the e-mail through the internet interface using the internet connection software.

17 Claims, 8 Drawing Sheets

| NAME | EMPLY ID | LOCATION | FAIL HIGH/LOW | EQUIPMENT | ACCESS |
|---|---|---|---|---|---|
| JOHN DOE | 1234 | SANTA CLARA | HIGH | SHOE STRAP | DENIED |
| TOM SMITH | 5678 | GARDEN GROVE | LOW | WRIST/SHOE | GRANTED |
| MARY JONES | 9898 | BOSTON | HIGH | WRIST | DENIED |
| PETER PAUL | 6543 | ROSEMONT | LOW | SHOE STRAP | GRANTED |
| MAX CHU | 587 | TAIPEI | LOW | WRIST/SHOE | GRANTED |
| ANG CHAN | 121 | TAIPEI | HIGH | SHOE STRAP | DENIED |
| SUZY SU | 111 | TAIPEI | HIGH | WRIST | DENIED |

FIG. 6

AUTOMATED ELECTROSTATIC DISCHARGE DEVICE TESTING SYSTEM

BACKGROUND OF THE INVENTION

1. Field of the Invention

The present invention relates to an automated test system for performing electrostatic discharge (ESD) device efficacy verification and for recording and transmitting results to an ESD supervisor or the like that utilizes the data for tracking ESD device use and replacement.

2. Description of the Related Art

Automated auditing systems for performing electrostatic discharge device efficacy verification and recording are generally known and described, for example, in U.S. Pat. No. 6,078,875 to Jubin et al., which patent is commonly assigned with the present application and is expressly incorporated herein by reference. The ESD audit system described in U.S. Pat. No. 6,078,875 generally relates to an automated test system for performing ESD device tests and recording the results for an ESD auditing program. The testing unit provides functionality for identifying an employee and for performing ESD efficacy tests for ESD devices utilized by that specific employee. The system includes testing circuitry for on-demand verification of efficacy of one or more ESD devices and automatic downloading of test data to a locally connected personal computer (PC).

A communication system interfaced with the automated ESD testing device allows the testing unit to communicate with a local central computer or processor which collects, stores and allows the manipulation of test data. The local computer receives information from the automated test system device which receives employee ID data via a magnetic strip reader or other information storage medium reader. The identify of the employee is verified from data stored in the central computer or PC database. The test unit assesses the efficacy of the of the ESD device or devices and, if functioning properly, the employee may proceed to their work area. Regardless of whether the device functions properly, the unit transmits the information to the locally interfaced personal computer and the computer stores the information. The test data of both pass and fails are compiled by the computer for statistical analysis for auditing.

Although the automated auditing system described U.S. Pat. No. 6,078,875 provides real time availability of ESD device efficacy to an on-site supervisor, the device does not permit the ESD efficacy data to be remotely accessed, retrieved or transmitted, and, in particular, the ESD supervisor is not notified in real time of an ESD device failure. As such, for example, an ESD supervisor located in the United States cannot remotely receive or access ESD device efficacy data from remote locations, such as in the Philippines, where work is being performed.

SUMMARY OF THE INVENTION

The present invention provides an automated system for performing ESD device tests and for recording and transmitting the results of ESD device efficacy data in the case of an ESD device failing a test or tests. In addition, all of the ESD device efficacy data can be remotely accessed either through an internet interface or from a remote terminal located on a local area network that has an ethernet interface.

According to one aspect of the present invention, the present invention is a method for automatically notifying of an efficacy failure of electrostatic discharge (ESD) device or devices. The method includes the steps of initiating an ESD device test protocol, testing an ESD device using the BSD device test protocol to produce a test result, automatically notifying and transmitting fail data as a result of the test result being a test failure of the ESD device, wherein the fail data is automatically collected and transmitted to a predetermined location, and storing the results of ESD testing regardless of the test result.

According to another aspect, the present invention is a system for automatically testing and providing notification of an efficacy failure of an electrostatic discharge (ESD) device or devices. The system includes testing circuitry for testing the efficacy of one or more ESD devices, a memory for storing ESD device testing protocol and ESD test result data, an ethernet interface, and a processor for controlling the testing circuitry and executing steps of the ESD device test protocol, wherein the processor automatically transmits notification through the ethernet interface that an ESD device has failed the ESD device testing protocol and controls the storage of ESD test result data in memory upon completion of an ESD device test.

According to another aspect, the present invention is a system for automatically testing and providing notification of an efficacy failure of an electrostatic discharge (ESD) device or devices. The system includes testing circuitry for testing the efficacy of one or more ESD devices, a memory for storing ESD device testing protocol, ESD device test results, employee identification information, e-mail messaging software, and interface connection software, an internet interface, and a processor for controlling the testing circuitry in accordance with the executed process steps of the ESD device testing protocol and for controlling the storing of the ESD device test results in memory, wherein the processor automatically provides e-mail notification of efficacy failure of an ESD device by collecting and formatting an ESD device test result into an e-mail message using the stored e-mail messaging software and forwarding the e-mail through the internet interface using the interface connection software.

This brief summary of the invention has been provided so that the nature of the invention may be understood quickly. A more complete understanding of the invention can be obtained by reference to the following detailed description of the preferred embodiment(s) thereof in connection with the attached drawings.

BRIEF DESCRIPTION OF THE DRAWINGS

FIG. 6 is a flow diagram illustrating the control software of the automated test unit according to the present invention;

DETAILED DESCRIPTION OF THE PREFERRED EMBODIMENT

Figure 1:
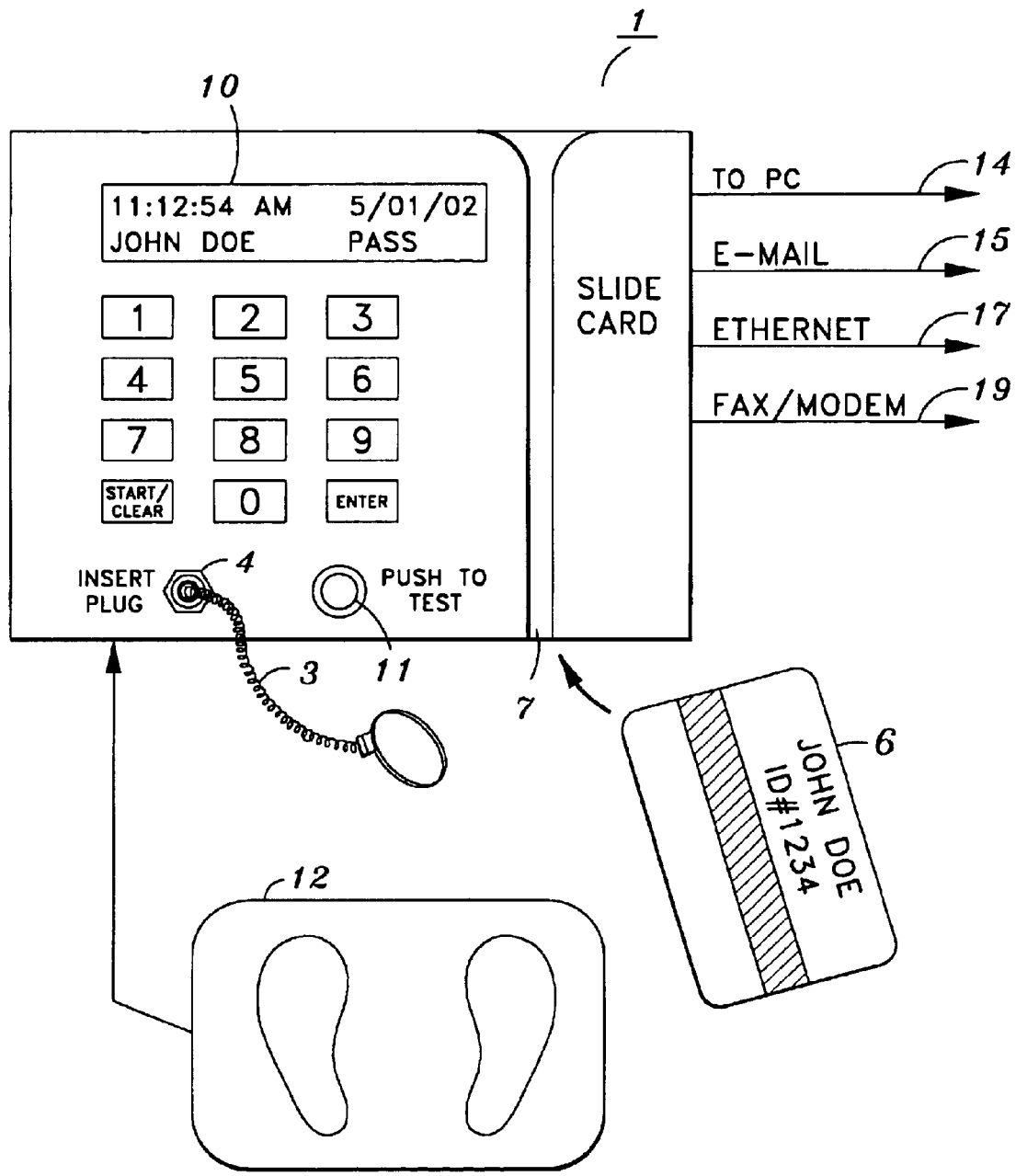
FIG. 1 illustrates a preferred embodiment of an improved automated auditing system according to the present invention.

FIG. 1 is an illustration of the automated test unit 1 which performs ESD efficacy device tests, records test data and/or transmits test data to a remote location. According to the present invention, when an employee reports for work, the employee inserts a connector from his or her ESD wrist strap 3 into port 4 of automated test unit 1. This connects the ESD device to test circuitry within automated test unit 1. The test circuitry is not shown in FIG. 1; however, such circuitry would be apparent to those who are skilled in the art and may be constructed in accordance with the automated auditing system disclosed in U.S. Pat. No. 6,078,875. After inserting the connector 3 into port 4, the employee swipes an ID card 6, which bears the employee's identification number and other pertinent information, such as which tests to be performed, through card reader slot 7 of automated test unit 1. Automated test unit 1 reads all information contained on employee ID card 6. In the alternative, automated test unit 1 may include a proximity reader which does not require a magnetic bar strip reader and, in such a case, the employee simply waves the card by the proximity reader which obtains the same information.

Automated test unit 1 utilizes the information on ID card 6 to identify the employee and what tests need to be performed for that employee. If the card is not read properly, "Void" will be displayed in LCD display 10. The employee may then slide the card through the slot again. Once the employee's identity is verified and the employee's name is displayed on display 10, the employee may press button 11 to initiate the test. The result of the test is indicated on display 10. If the test is successful, the employee unplugs the wrist strap from automated test unit 1 and proceeds to his/her work area. If the employee's ID data indicates that an additional ESD device test is required, the display screen 10 will indicate that the next test will begin and what test that will be.

In the present case, automated system 1 is interfaced with a footwear test unit 12. The employee is prompted to stand on the footwear test unit 12 and the test results are displayed again on display screen 10. To test the integrity of footwear, the employee would step on the grounded steel plates in footwear tester 12 which forms part of the footwear tester. Other footwear testers may also be used, for instance, if the floor is grounded, a steel plate is not required. If independent testing of each foot is desired, multiple plates may be provided or the worker may be required to test one foot at a time. Other footwear testing methods and apparatus will be apparent to those skilled in the art.

In addition to determining which test an employee must take based on the information contained in the employee's ID card, automated test unit 1 also includes logic which can be used to control employee access to work areas. For example, an employee may be required to verify the efficacy of his or her ESD device before entering a clean room. The door to the clean room is controlled by the test result determinations. In this regard, automated test unit 1 will send a signal to door locks in the secure work areas which deny or grant access to the specific work area.

Test results are stored by internal memory 30 of automated system 1 and can be periodically transferred to PC interface 14 or results can be e-mailed through the internet or web via e-mail interface 15, transferred through the network to a remote PC through ethernet interface 17, or the results can be transmitted by fax/modem through interface 19. Moreover, because of the ethernet connection, automated test unit 1 may be remotely accessed by an ESD supervisor or the like through a remote workstation in a local area network.

Automated test unit 1 also includes a keypad which can be utilized should an employee fail to utilize the employee's ID card. In addition, the automated unit 1 system data may be locally accessed through a series of keypad entries by the ESD supervisor.

Figure 2:
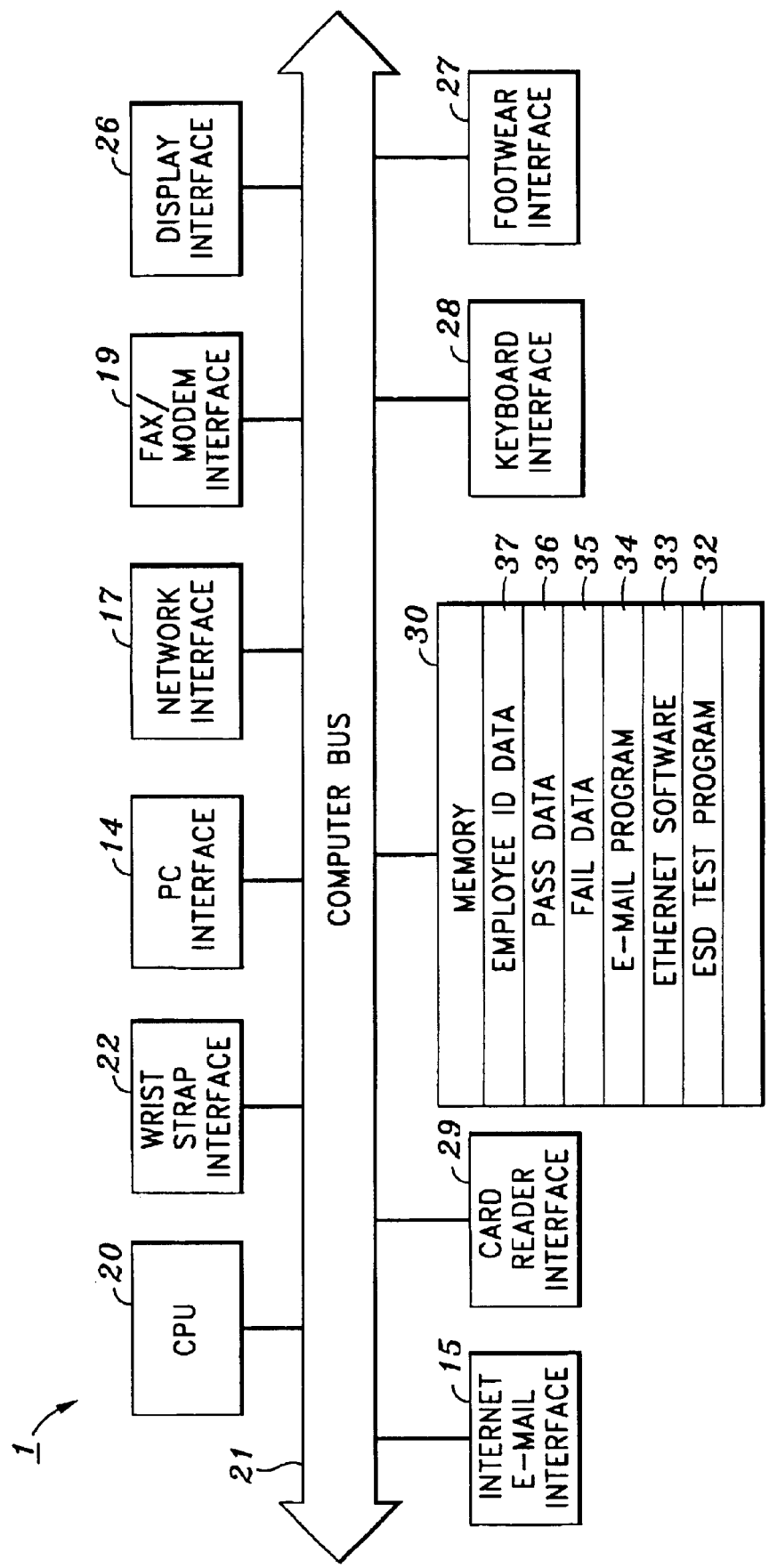
FIG. 2 is a functional block diagram which represents the internal process and data manipulation of a preferred embodiment of an automated auditing system according to the present invention.

FIG. 2 is a detailed lock diagram showing the internal construction of processing and data manipulation of automated test unit 1. As shown in FIG. 2, automated test unit 1 includes central processing (CPU) 20 interfaced with computer bus 21. Also interfaced with computer bus 21 is wrist strap interface 22, PC interface 14, network interface 17, fax/modem interface 19, display interface 26, footwear interface 27, keyboard interface 28, and card reader interface 29.

Automated test unit 1 also includes main memory 30 which interfaces with computer bus 21 so as to provide both random access memory and ready only memory storage for use by CPU 20 when executing software applications such as ESD test program software 32. More specifically, CPU 20 loads software applications from main memory 30 and executes the software applications in order to perform ESD testing and ESD data collection. Main memory 30 also includes ethernet software 33, e-mail program 34, "Fail" data file 35, "Pass" data file 36 and employee ID data 37. In accordance with test requirements and data manipulation and transmission, stored software applications are activated which permit processing of test requirements and storage, manipulation and transmission of data. Typically, software applications stored on main memory 30, such as ESD test program 32, e-mail program 34, and ethernet software 33, have been stored in main memory 30 by downloading the software applications by a computer medium, such as a floppy disk, CDROM or by downloading the software application directly from a network server or WEB.

Main memory 30 also stores data files which includes "Pass" data file 36, "Fail" data file 35 and employee ID data 37 in compressed or uncompressed format. These files can be accessed locally or remotely and can be edited and/or erased.

A detailed description of how the automated test unit 1 of the present invention performs ESD device efficacy testing and data storage, manipulation and transmission will now be explained with respect to FIGS. 3–5.

Figure 3:
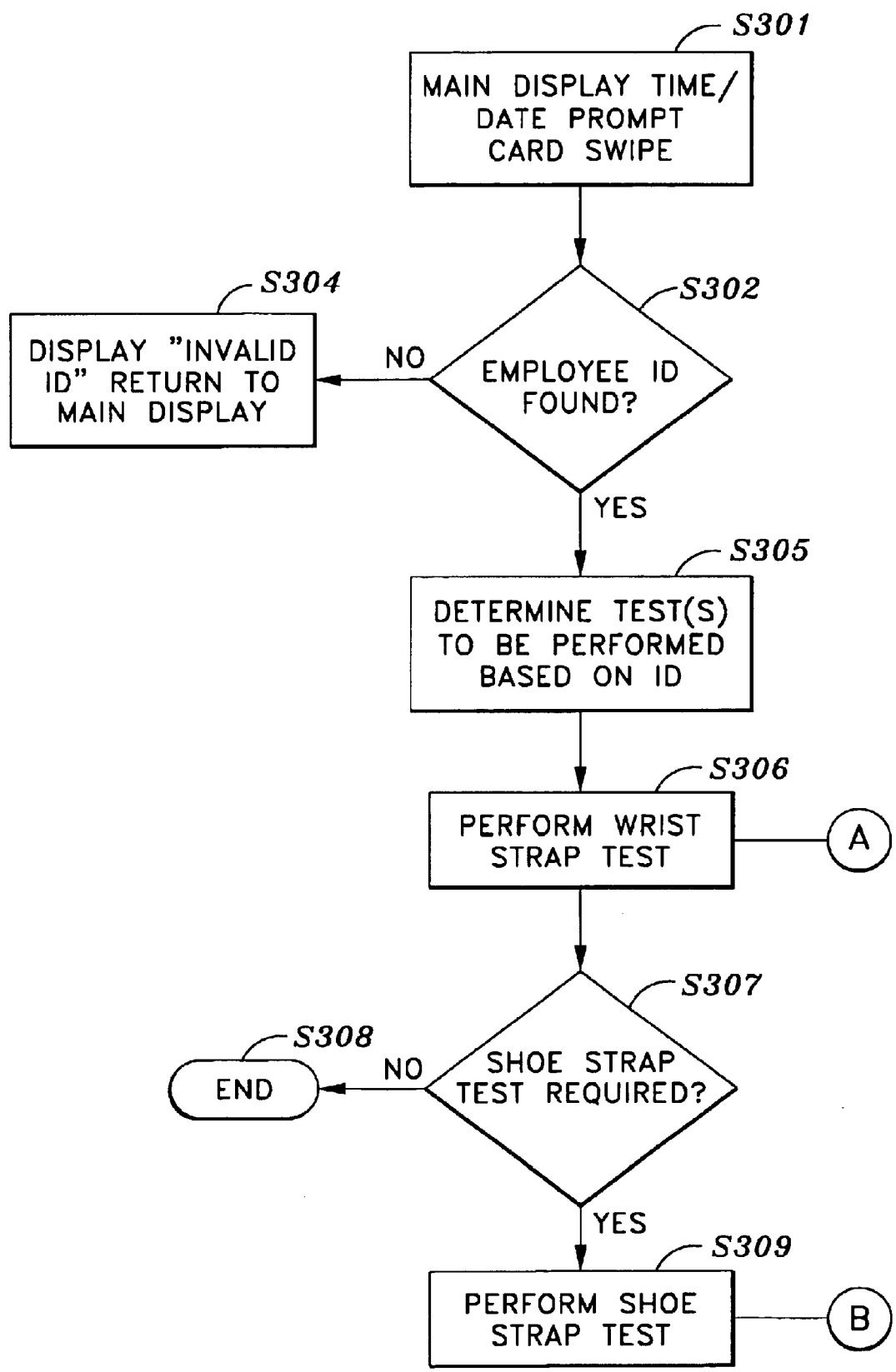
FIG. 3 illustrates an e-mail interface screen which provides the ESD device efficacy data.
Figure 4:
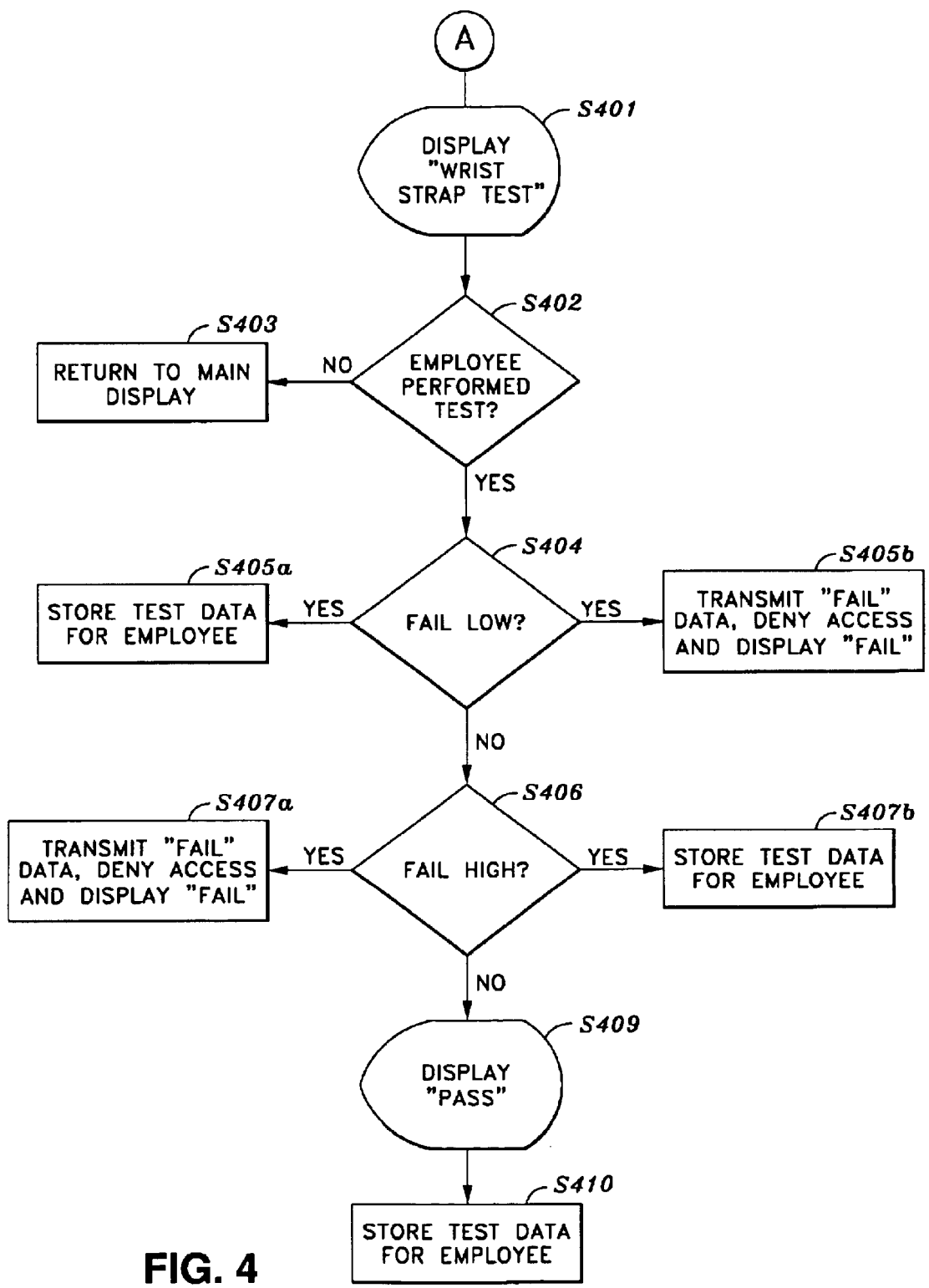
FIG. 4 is a flow diagram illustrating the control software of the automated test unit according to the present invention.
Figure 5:
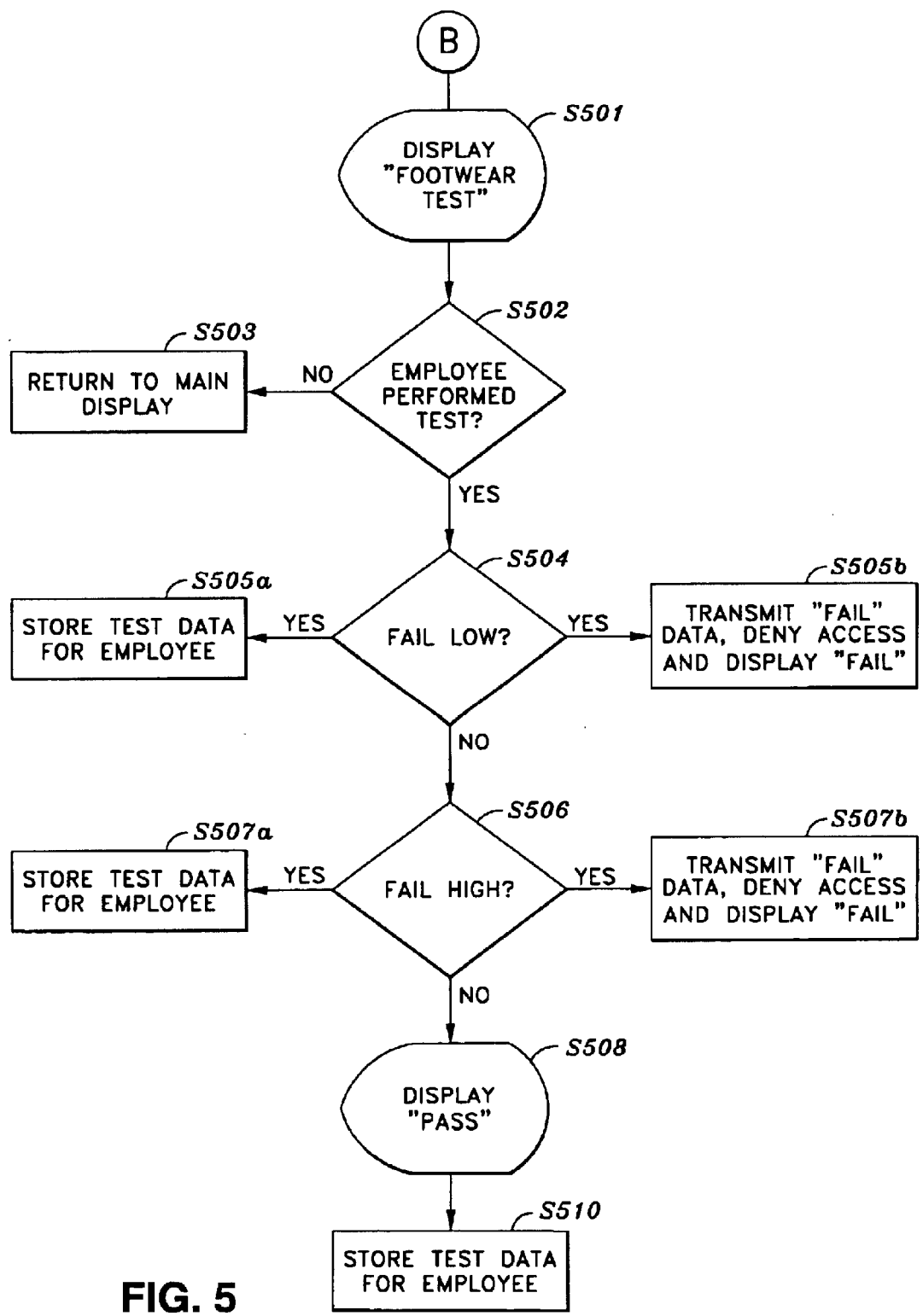
FIG. 5 is a flow diagram illustrating the control software of the automated test unit according to the present invention.

FIGS. 3, 4 and 5 are flow diagrams describing the operation of the automatic test unit 1 in more detail. FIGS. 3–5 describe a preferred embodiment of the automated test unit 1 which includes both ethernet connection capabilities as well as e-mail messaging capabilities, either through the internet/web or through the local area network.

In operation, an employee approaches automated test unit 1 and reads display 10 to determine its operation condition. In step S301, automated test unit 1 continuously displays, when in standby mode, the time and date and prompts an employee for ID card swipe. Upon swiping ID card 6 through card slot 7, automated test unit 1 compares the information contained on ID card 6 with employee data 37 stored in main memory 30 in step S302. In the case the employee ID data is not located in step S302, in step S304, display 10 displays to the employee "invalid ID" and display 10 returns to standby mode and displays time and date and prompts for a card swipe. In the case that automated test unit 1 verifies the employee ID, based on the data located in employee ID data 37, automated test unit 1 displays the employee's name on display 10 and flow proceeds to step S305. Automated test unit 1 determines, based on the information on employee ID card 6, which test to perform for that specific employee in step S305.

Once a determination has been made as to what test or tests should be performed, flow proceeds to step S306 in which the first ESD device efficacy test protocol begins. In the present example, the wrist strap test is to be performed. A further explanation of the wrist strap test protocol and data storage and transmission will be discussed with respect to FIG. 4. If no further testing is to be performed, flow proceeds to step S308 and all of the ESD device testing ends. If, based on the employee's information on employee ID card 6 indicates that the specific employee's shoe strap/footwear should be tested as well, flow proceeds to step S307 where it is determined if the shoe strap/footwear should be tested. Flow proceeds to step S309 and shoe strap/footwear testing protocol begins. The shoe strap/footwear test protocol will be discussed in greater detail with respect to FIG. 5.

A detailed description of the wrist strap testing protocol will now be provided. Turning to FIG. 4 and the flow diagram describing wrist strap testing protocol, in step S401, display 10 displays to the employee "Wrist Strap Test" to initiate the wrist strap test. At this point, the employee inserts wrist strap connector 3 into plug 4 of automated test unit 1. Upon inserting connector 3 into plug 4 of automated test system 1, the employee must press test button 11 in order to begin the test. Should the employee fail to press test button 11, for example, if after 5 seconds an employee does not push test button 11 in step S402, automated test unit 1 determines if the employee has initiated the test. If not, in step S403, flow returns to step S301 in which automated test unit 1 returns to standby mode and display 10 returns to displaying time and date and prompts for a card swipe.

Once the employee pushes test button 11, the automated test unit begins the testing protocol of the wrist strap in step S404. When the employee initiates the test of the wrist strap, automated test unit 1 performs a test and records whether or not the test was passed. If the test was passed, automated test unit displays a "pass" on display 10.

According to the present invention, automated test unit 1 records one of three types of results and, based on the result, performs one of two operations. If the test is failed, in step S404, the type of failure is displayed, for example, display 10 either displays "fail/low" or "fail/high" or "fail" will be displayed. In this regard, "fail/low" means that ESD device has a resistance which is below a preset resistance level and "fail/high" means that the ESD device has a resistance above a preset resistance level. For further explanation of ESD device efficacy testing, a discussion is provided in U.S. Pat. No. 6,078,875 which is hereby incorporated by reference. In the case of a fail/low in step S405a, the test data for the employee is stored in memory 30 and, in step S405b, data is also transmitted to an ESD supervisor or the like, either locally or remotely. In the present invention, since automated test unit 1 has ethernet interface and internet e-mail capabilities, a message is transmitted automatically to an ESD supervisor that the employee has failed the wrist strap test. In the case in step S404, the wrist strap has a fail/low result and, based on that, the employee would take appropriate corrective action and/or the ESD supervisor would contact the employee to address the failure before being provided access to the work area.

In step S405b, should the employee fail the wrist strap test, automated test unit 1, not only transmits the failed data to an appropriate ESD supervisor or the like, but also, if programmed appropriately, denies an employee access to a specific work area based on a failed test. That is, automated test unit 1 is connected to each ID card secured work area and sends a signal to a given secured work area to either deny or grant access to the employee. This information will also be transmitted to an ESD supervisor or the like that not only did the employee fail the wrist strap test, but also that the employee was denied access.

In order to provide real time failure information to an ESD supervisor or the like, automated test unit 1 has various messaging capabilities. Automated test unit 1 can either send a message to an ESD supervisor, through its ethernet connection, who is remotely accessing data from a local area network or an e-mail can be generated automatically upon a failure and is transmitted either through the ethernet connection to a local area networked computer or, via the internet, to a remote computer.

In step S404, if the employee does not fail/low, flow proceeds to step S406 in which it is determined if the employee's wrist strap failed at a resistance above a preset limit. Should the employee's wrist strap fail/high in step S407a, fail data is transmitted via the network or e-mail to an appropriate authority who can view the ESD device efficacy data. In addition, if appropriately programmed, automated test unit 1 will either grant or deny access to a specific work area for that employee and will display "fail" on display 10. In step S407b, the automated test unit 1 stores the test results for that specific employee in fail data file 35 with that specific employee ID information together with time/date stamp data of the test in memory 30. Should the employee's wrist strap pass the testing protocol, in step S409, "Pass" is displayed on display 10 and flow proceeds to step S410 in which pass data is stored for that specific employee in pass data file 36 together with the employee ID information and time/date stamp data for the test.

Reverting back to the flow diagram of FIG. 3, if it is determined in step S307 that a shoe strap/footwear test is required for the employee, flow proceeds to step S501 in FIG. 5. The footwear test may follow the wrist strap test or may be given alone without any other testing. In step S501, display 10 displays "Footwear Test" which initiates the footwear test protocol. Once the footwear test begins, the employee steps on the footwear test unit 12, which can either be a grounded stainless steel plate in the floor or a footwear test unit such as the one shown in FIG. 1. After stepping onto footwear test unit 12, the employee pushes test button 11 to begin the footwear test. In step S502, it is determined if the employee has performed the test. If after five seconds the employee does not push test button 11, in step S503, flow returns to step S301 in which automated test unit 1 returns to standby mode and display 10 displays time and date information and prompts for a card swipe.

On the other hand, if the employee has pressed button 11 to begin the footwear test, flow proceeds to step S504 in which it is determined if the footwear has a resistance below a preset limit. If the footwear tests below a preset resistance limit, test data for the employee is stored as fail/low in step S505a and fail data is transmitted in step S505b to the ESD supervisor or the like via either ethernet connection 17 to a local area networked computer or the fail data is transmitted by e-mail through the internet depending on how the system is set up by the ESD supervisor. One of ordinary skill in the art would understand that automated test unit 1 could readily determine how to transmit the fail data automatically using either a messaging system via the ethernet connection 17 or using the e-mail software stored in memory 30 which could automatically send e-mail to a designated individual through e-mail interface 15 via the internet or web. As such, no further detail will be provided herein.

As shown in FIG. 6, there is an example of an e-mail notification sent via the internet to a remote computer. The e-mail can be generated using Lotus Notes, CC mail, Hot Mail, Outlook Express, or the like. The e-mail in the preferred embodiment would include the employee's name, the employee's ID, the location in which the employee performed the test, the fail status, i.e., a high/low fail, the equipment that failed, and whether or not access to the employee's work area was granted or denied. In addition, the employee test data is stored in either pass data file 36 or fail data file 35. Test result data may be saved, edited or imported into the local PC via PC interface 15 or to a remote local area networked PC via ethernet interface 17. As shown in FIG. 6, employee data such as names, ID number, location, type of test and fail status may be input into a data file. This data file may be supplemented with data from imported files. The ESD supervisor may append, update or replace existing files with imported files. The ESD supervisor may also open and edit existing files stored in memory 30 and save edited files as new files. These databases may then be downloaded from automated test unit 1 via the ethernet connection or directly to the locally attached PC.

An additional advantage of having remote accessibility is that the ESD efficacy data may be pushed to an Internet web site which permits access to the data remotely over the Internet without the EDS supervisor having to add specialized software onto his/her PC to access data produced by automated test unit 1. That is, automated test unit 1 can push data to a local or remote networked web server that hosts a web site which may be accessed using a password or the like in order to view, download and/or manipulate ESD efficacy device test data.

Test data also may be easily transferred into spreadsheets. Other formats or databases may be used as appropriate. For example, the data may be provided in a format which is compatible with commercially available database applications, such as Microsoft Access™.

Each time automated test unit 1 transfers fail data or stores fail/pass data or is polled by a remote or local computer, the data can be downloaded to the computer and erased from the automated test unit's memory 30. Moreover, the ESD supervisor or the like may periodically access test data by locally or remotely viewing or copying, without erasing, the data from memory 30 of automated test unit 1. In this regard, an ESD supervisor can generate custom ESD device efficacy reports. For example, the ESD supervisor can select a specific location, for example, the Philippines Fabrication Plant, and request and receive all ESD device efficacy data for the entire location, all fail data, fail/high data only, fail/low data only or any combination of data from any of the above reports. The ESD supervisor can further generate a customized report for a specific day and/or time for a specific employee or group of employees. Such customization of data reports would be apparent to those skilled in the art.

Reverting to FIG. 5, in the case that the footwear does not fail low, flow proceeds to step S506, in which it is determined if the footwear has a fail/high, meaning that it has a resistance above a preset limit. If the footwear has a fail/high in step S507b, the fail data is automatically transmitted either through the ethernet interface to a local area networked computer or an e-mail message is sent via the web/internet, using the e-mail program stored in memory 30. In addition, "fail" is displayed on display 10 and, in step S507a, the test data is stored for the employee. If appropriately programmed, automated test unit 1 will also deny access to the employee's work area so that the employee cannot enter without the properly functioning ESD protection.

If a test was passed in step S508, display 10 displays "pass" and permits access to the employee's work area and flow proceeds to step S510 in which the pass data is stored for that specific employee in memory 30.

Figure 7:
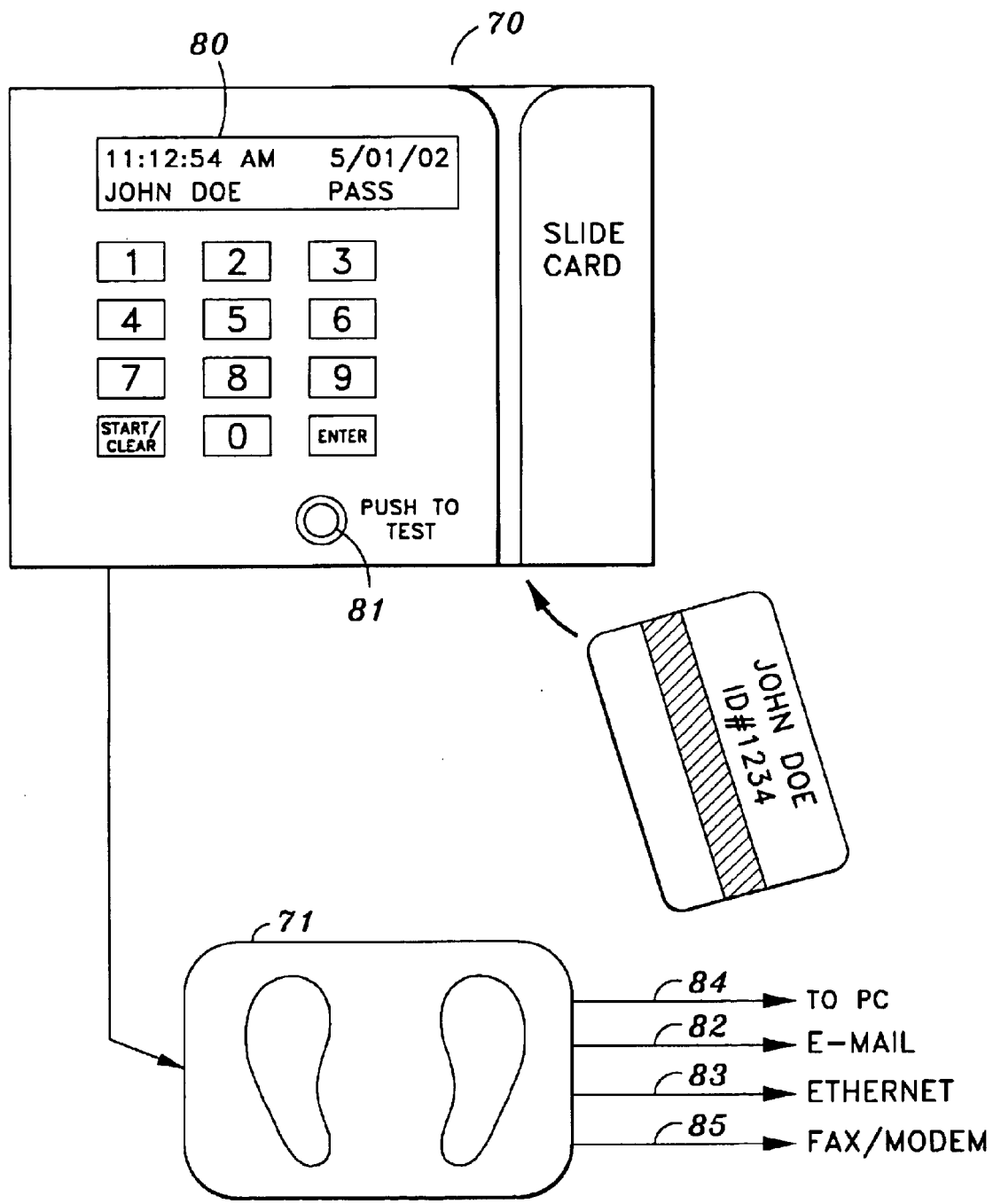
FIG. 7 is a second embodiment of the present invention which is employed within an intelligent footwear test unit.

FIG. 7 shows an alternative embodiment of the present invention in which the footwear test unit includes all the intelligence described with respect to automated test unit 10 in FIG. 2 in the footwear test unit. Specifically, as shown in FIG. 7, automated test unit 70 includes circuitry for reading a magnetic card strip or the like and transfers the data to the footwear unit. Automated test unit 70 only provides information for displaying employee ID, time/date information and test status. In addition, much like automated test unit 1, automated test unit 70 includes a card reader for reading the employee's ID card. Information gathered by automated test unit 70 is transmitted to intelligent footwear tester 71 which includes main memory 30 for storing ESD test program, ethernet software e-mail program, fail data files, pass data files and employee ID data. The only difference between automated test unit 1 described in the preferred embodiment and intelligent footwear test unit 71 is that all the intelligence, as well as all of the interface connections, are situated in the intelligent footwear test unit 71. Because intelligent footwear is limited to the testing of the footwear only, the testing protocol is limited to the testing of footwear. However, one of ordinary skill in the art could modify automated test unit 70 so as to also include test logic for wrist bands or the like.

Figure 8:
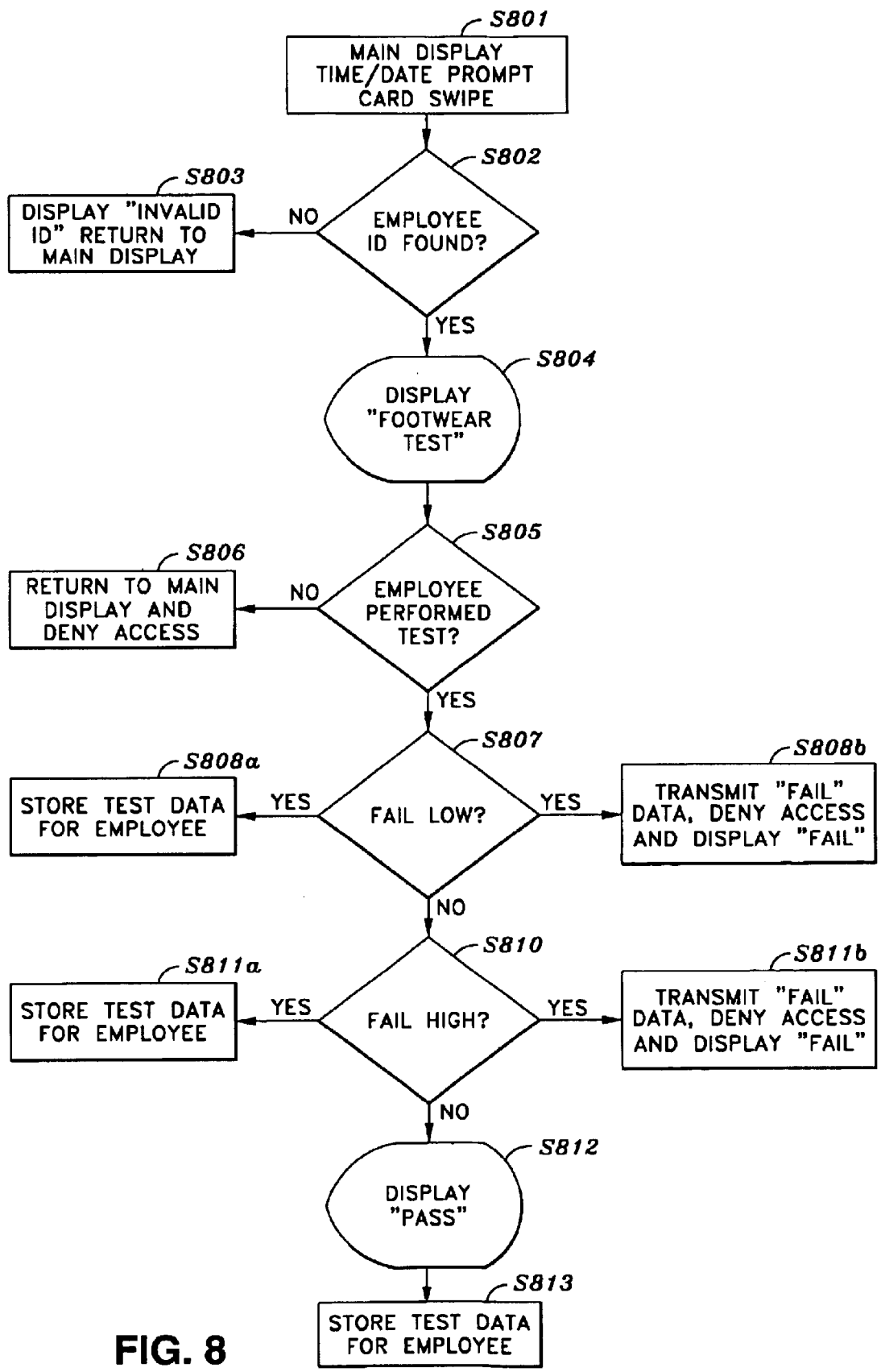
FIG. 8 is a flow diagram illustrating the control software of the intelligent footwear test unit according to the second embodiment in FIG. 7.

With reference to the flow chart in FIG. 8, when an employee approaches intelligent footwear test unit 71, display 70 displays the time and date and prompts for a card swipe in step S801 while in standby mode. Once the employee swipes his card through the card reader slot in test unit 70, intelligent footwear test unit 71 receives employee ID information from automated test unit 70. Intelligent footwear unit 71 compares the employee information downloaded from the ID card to the employee ID database stored in its main memory to determine if the employee ID is valid in step S802. In a case that the employee ID cannot be verified, in step S803, test unit 70 displays invalid ID to the employee and main display 80 returns to the time and date and card prompt display. However, if the employee ID is located, flow proceeds to the test protocol and main display 80 displays "footwear test" which will prompt the employee to begin the footwear test by stepping onto the intelligent footwear unit 71. In step S805, if the employee has not stepped onto the unit and pressed the push test button 81 within a predetermined time, for example, five (5) seconds, in step S805, the system returns to standby mode and access is denied to the work area. On the other hand, if the employee initiates the test by stepping on intelligent footwear test unit 71 and presses the test button 81 within the predetermined time, flow proceeds to step S807 in which it is determined if the footwear fail is low, meaning that the resistance of the footwear is below a preset limit.

In step S807 if the footwear fail is low, the fail data is stored into main memory and fail data is automatically transmitted to the ESD supervisor in steps S808a and S808b. The ESD supervisor is either notified by e-mail through the internet via e-mail interface 15 or if the ESD supervisor is connected to a local area network through ethernet interface 83. In this regard, the manner in which the ESD supervisor is informed of the fail can either be through the e-mail system or by other messaging techniques. Simultaneously, the employee is notified that he/she has failed the test since the word "fail" is displayed on main display 80. Should the footwear fail high, flow proceeds to step S810 and, in steps S811a and S811b, test data is stored for the employee in a fail data file in memory 30 and the information is transmitted much in the same way as it would be transmitted for the fail low to the ESD supervisor.

On the other hand, if the employee's footwear passes all of the test protocols, the employee is informed that his test wear passes because main display 80 displays word "pass" in step S812. In step S813, the pass data is stored in the pass data file in main memory 30.

As discussed with respect to automated test system 1, the memory of intelligent footwear test unit 71 can be accessed remotely or locally through local PC interface 84 or remotely via ethernet interface 83 from a remote computer on the local area network. It is to be understood that both the automated test system of the preferred embodiment and the intelligent footwear test unit have been described as having both e-mail and ethernet capabilities; however, both systems may have either e-mail capabilities only, ethernet capabilities only or both, for remotely transmitting fail data information.

Although the foregoing is provided for purposes of illustrating, explaining and describing two automated test systems, modifications and adaptations to the described systems and other embodiments will be apparent to those skilled in the art and may be made without departing from the scope of spirit of the invention.

What is claimed is:

1. A method for the automatic notification of an efficacy failure of an electrostatic discharge (ESD) device, comprising the steps of:
    initiating an ESD device test protocol;
    testing an ESD device using the ESD device test protocol to produce a test result;
    automatically notifying and transmitting fail data as a result of the test result being a test failure of the ESD device, wherein the fail data is automatically collected and transmitted to a predetermined location; and
    storing the test result.

2. A method according to claim 1, further comprising the step of inputting employee identification information.

3. A method according to claim 2, wherein the initiating step further includes determining a type of ESD device test protocol to perform associated with employee identification information.

4. A method according to claim 3, wherein the testing step includes the step of testing a resistance of an ESD device attached to an individual and determining if the resistance of the ESD device is within a predetermined range and wherein, if the resistance of the ESD device is above or below the predetermined range, outputting fail data.

5. A method according to claim 4, wherein the automatically notifying and transmitting step includes the steps of collecting both employee identification information and output fail data and formatting the collected employee identification information and fail data into a visually displayable message.

6. A method according to claim 5, wherein the ESD device is one of a wrist strap device and a footwear device, and wherein, in the automatically notifying and transmitting step, the visually displayable message is an e-mail message transmitted through the internet.

7. A method according to claim 5, wherein the ESD device is one of a wrist strap device and a footwear device, and wherein, in the automatically notifying and transmitting step, the visually displayable message is transmitted through a local area network via an ethernet interface.

8. A method according to claim 5, wherein the ESD device is one of a wrist strap device and a footwear device, and wherein the notifying and transmitting step includes pushing fail data to a local or remote web server which stores the fail data wherein the web server hosts a fail data web site which is access-controlled.

9. A method according to claim 1, further comprising the step of controlling access to a work area based on the result of the ESD test.

10. A method according to claim 1, further comprising remotely accessing, through an ethernet interface, the stored results of ESD testing.

11. A method according to claim 10, wherein, in the accessing step, the stored result of ESD testing is used to generate ESD device efficacy reports wherein the reports can be customized for a specific employee, location, date/time, device or any variation of the stored results of ESD testing.

12. A method according to claim 1, wherein the automatically notifying and transmitting is performed in real time with testing of the ESD device.

13. A system for automatically testing and providing notification of an efficacy failure of an electrostatic discharge (ESD) device, comprising:
    testing circuitry for testing the efficacy of the ESD device;
    a memory for storing an ESD device test protocol and ESD test result data;
    an ethernet interface; and
    a processor for controlling the testing circuitry and executing the ESD device test protocol,
    wherein the processor automatically transmits notification through the ethernet interface that the ESD device has failed the ESD device test protocol and stores the ESD test result data in the memory upon completion of an ESD device test.

14. A system according to claim 13, wherein the ESD test result data can be remotely accessed through the ethernet interface.

15. A system according to claim 13, wherein the memory is further for storing employee identification information.

16. A system according to claim 15, further comprising an employee identification input device adapted to receive input employee identification information, wherein the processor verifies the input employee identification information with the employee identification information prior to initiating an ESD device test protocol.

17. A system for automatically testing and providing an e-mail notification of an efficacy failure of an electrostatic discharge (ESD) device, comprising:
    testing circuitry for testing the efficacy of the ESD device;
    a memory for storing an ESD device test protocol, ESD device test results, employee identification information, e-mail messaging software, and interface connection software;
    an internet interface; and
    a processor for controlling the testing circuitry in accordance with the ESD device test protocol and for storing the ESD device test results in the memory,
    wherein the processor automatically provides the e-mail notification of the efficacy failure of the ESD device by collecting and formatting the ESD device test results into the e-mail message using the e-mail messaging software and forwarding the e-mail through the internet interface using the interface connection software.

* * * * *